United States Patent
Kadkhodayan et al.

(10) Patent No.: US 8,522,716 B2
(45) Date of Patent: Sep. 3, 2013

(54) PROTECTIVE COATING FOR A PLASMA PROCESSING CHAMBER PART AND A METHOD OF USE

(75) Inventors: Bobby Kadkhodayan, Pleasanton, CA (US); Jon McChesney, Santa Clara, CA (US); Eric Pape, Newark, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1009 days.

(21) Appl. No.: 12/368,093

(22) Filed: Feb. 9, 2009

(65) Prior Publication Data

US 2009/0200269 A1 Aug. 13, 2009

Related U.S. Application Data

(60) Provisional application No. 61/006,983, filed on Feb. 8, 2008.

(51) Int. Cl.
| | |
|---|---|
| *C23F 1/00* | (2006.01) |
| *C23F 1/08* | (2006.01) |
| *C23C 14/34* | (2006.01) |
| *C23C 16/00* | (2006.01) |
| *H05H 1/24* | (2006.01) |

(52) U.S. Cl.
USPC .............. 118/723 I; 156/345.47; 156/345.48; 216/71; 427/523; 427/569

(58) Field of Classification Search
USPC ................................. 118/723 I; 156/345.47
See application file for complete search history.

(56) References Cited

U.S. PATENT DOCUMENTS

| | | | | |
|---|---|---|---|---|
| 3,723,481 | A | * | 3/1973 | Bobear .......................... 523/179 |
| 5,458,162 | A | | 10/1995 | Sinha |
| 5,702,387 | A | | 12/1997 | Arts et al. |
| 5,886,863 | A | * | 3/1999 | Nagasaki et al. ............. 361/234 |
| 6,019,060 | A | | 2/2000 | Lenz |
| 6,070,444 | A | | 6/2000 | Lontine et al. |
| 6,073,577 | A | | 6/2000 | Lilleland et al. |

(Continued)

FOREIGN PATENT DOCUMENTS

| | | |
|---|---|---|
| JP | 7-201824 A | 8/1995 |
| JP | 11-204293 | 7/1999 |
| JP | 2007-180596 A | 7/2007 |

OTHER PUBLICATIONS

International Search Report and Written Opinion mailed Aug. 28, 2009 for PCT/US2009/000786.

(Continued)

*Primary Examiner* — Parviz Hassanzadeh
*Assistant Examiner* — Nathan K Ford
(74) *Attorney, Agent, or Firm* — Buchanan Ingersoll & Rooney PC

(57) ABSTRACT

A flexible polymer or elastomer coated RF return strap to be used in a plasma chamber to protect the RF strap from plasma generated radicals such as fluorine and oxygen radicals, and a method of processing a semiconductor substrate with reduced particle contamination in a plasma processing apparatus. The coated RF strap minimizes particle generation and exhibits lower erosion rates than an uncoated base component. Such a coated member having a flexible coating on a conductive flexible base component provides an RF ground return configured to allow movement of one or more electrodes in an adjustable gap capacitively coupled plasma reactor chamber.

16 Claims, 5 Drawing Sheets

(56) References Cited

U.S. PATENT DOCUMENTS

| | | |
|---|---|---|
| 6,221,221 B1 * | 4/2001 | Al-Shaikh et al. ....... 204/298.02 |
| 6,242,360 B1 | 6/2001 | Fischer et al. |
| 6,277,237 B1 | 8/2001 | Schoepp et al. |
| 6,540,745 B1 | 4/2003 | Fairbourn et al. |
| 6,837,968 B2 | 1/2005 | Brown et al. |
| 6,857,387 B1 | 2/2005 | Sun et al. |
| 6,899,109 B1 | 5/2005 | Nguyen |
| 7,019,956 B2 | 3/2006 | Fujii et al. |
| 7,147,634 B2 | 12/2006 | Nesbitt |
| 7,244,336 B2 | 7/2007 | Fischer et al. |
| 7,375,946 B2 | 5/2008 | White et al. |
| 2003/0029564 A1 | 2/2003 | Brown et al. |
| 2003/0029568 A1 | 2/2003 | Brown et al. |
| 2004/0083977 A1 | 5/2004 | Brown et al. |
| 2004/0134427 A1 * | 7/2004 | Derderian et al. ............ 118/715 |
| 2004/0241057 A1 | 12/2004 | Goodley et al. |
| 2005/0042881 A1 | 2/2005 | Nishimoto et al. |
| 2005/0056370 A1 | 3/2005 | Brown et al. |
| 2006/0027328 A1 | 2/2006 | Benzing et al. |
| 2007/0175861 A1 | 8/2007 | Hwang et al. |
| 2007/0201307 A1 | 8/2007 | Lobe et al. |
| 2007/0204797 A1 | 9/2007 | Fischer |

OTHER PUBLICATIONS

Official Action drafted Sep. 12, 2012, dispatched Sep. 18, 2012 for Japanese Patent Appln. No. JP 2010-545888.

* cited by examiner

US 8,522,716 B2

PROTECTIVE COATING FOR A PLASMA PROCESSING CHAMBER PART AND A METHOD OF USE

CROSS-REFERENCE TO RELATED APPLICATIONS

This application claims priority under 35 U.S.C. §119 to U.S. Provisional Application No. 61/006,983 entitled A PROTECTIVE COATING FOR A PLASMA PROCESSING CHAMBER PART AND A METHOD OF USE and filed on Feb. 8, 2008, the entire content of which is hereby incorporated by reference.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and lower electrodes. An electric field is established between the electrodes to excite a process gas into the plasma state to process substrates in the reaction chamber.

SUMMARY

In an embodiment, a coated RF return strap includes a curved metal strip having a surface and a flexible coating bonded to the surface, the coating comprising a polymer or elastomer wherein the coating provides erosion resistance in an atmosphere of plasma generated radicals and protects the metal strip from the radicals.

In a second embodiment, a plasma processing apparatus is provided which comprises a vacuum chamber for plasma processing of a semiconductor substrate therein, and a plasma processing assembly for use in the vacuum chamber. The assembly comprises a first member bonded to a second member by an elastomer bond and a silicone base elastomeric material having improved erosion resistance to plasma generated radicals, the silicone base elastomeric material surrounding the elastomer bond and sealing a mating surface of the first member to a mating surface of the second member to protect the elastomer bond from plasma generated radicals.

A third embodiment provides a method of processing a semiconductor substrate in a plasma processing apparatus wherein a substrate is placed on a substrate support in a reaction chamber of a plasma processing apparatus beneath an upper electrode assembly. A process gas is introduced into the reaction chamber and plasma is generated from the process gas in the reaction chamber between the upper electrode assembly and the substrate. The substrate is processed with the plasma while the coated RF return strap transmits RF power between parts of the chamber exposed to plasma generated radicals.

In still another embodiment, a method of processing a semiconductor substrate in a plasma processing apparatus includes placing a substrate on a substrate support in a reaction chamber of a plasma processing apparatus of the second embodiment. A process gas is introduced into the reaction chamber, a plasma is generated from the process gas in the reaction chamber between an upper electrode assembly and the substrate, and the substrate is processed with the plasma. The silicone base elastomeric material protects the elastomer bond from plasma generated radicals during plasma processing of the substrate.

BRIEF DESCRIPTION OF THE DRAWINGS

Drawings

DETAILED DESCRIPTION

Control of particulate contamination on the surfaces of substrates such as flat panel displays and semiconductor wafers during the fabrication of integrated circuits is essential in achieving reliable devices and obtaining a high yield. Processing equipment, such as plasma processing apparatuses, can be a source of particulate contamination. For example, the presence of particles on the wafer surface can locally disrupt pattern transfer during photolithography and etching steps. As a result, these particles can introduce defects into critical features, including gate structures, intermetal dielectric layers or metallic interconnect lines, resulting in the malfunction or failure of the integrated circuit component.

Reactor parts with relatively short lifetimes are commonly referred to as "consumables," for example, silicon electrodes. If the consumable part's lifetime is short, then the cost of ownership is high. Silicon electrode assemblies used in dielectric etch tools deteriorate after a large number of RF hours (time in hours during which radio frequency power is used to generate the plasma). Erosion of consumables and other parts generates particulate contamination in plasma processing chambers. Erosion can occur on parts directly exposed to plasma or on parts outside the confined plasma region of the chamber due to exposure to a high density of radicals such as fluorine and/or oxygen radicals generated by the plasma of process gas.

Figure 1:
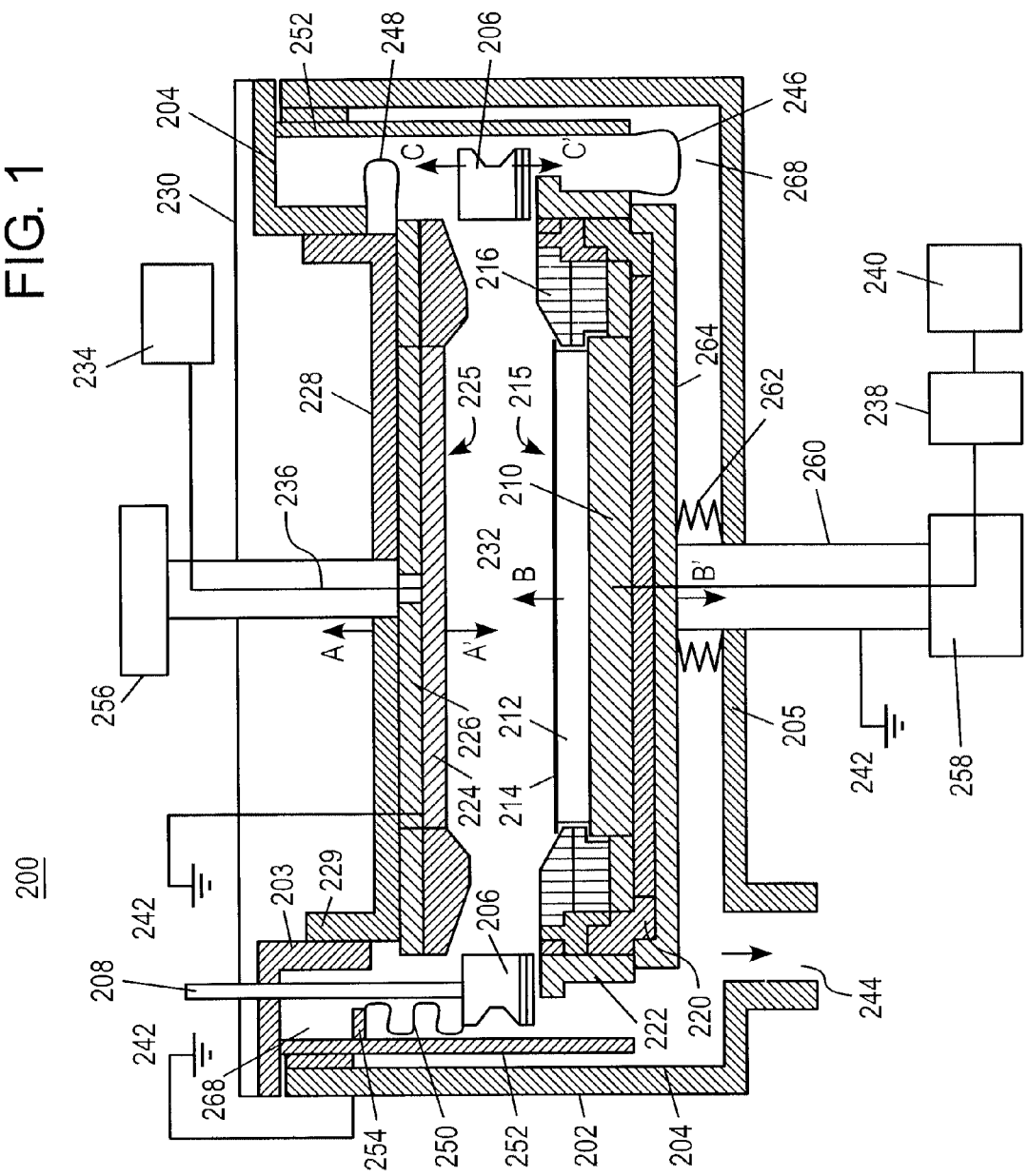
FIG. 1 shows a schematic diagram of an adjustable gap capacitively-coupled plasma processing chamber including embodiments of a coated member.

FIG. 1 shows an exemplary embodiment of an adjustable gap capacitively-coupled plasma (CCP) processing chamber 200 of a plasma processing apparatus. The chamber 200 allows accurate control of an electrode gap 232 between a lower surface of an upper electrode 224 of an upper electrode assembly 225 and an upper surface of a substrate 214 supported on a lower electrode assembly 215. During multistep processing of wafers, the gap height may be changed one or more times to optimize wafer processing conditions.

The chamber 200 comprises chamber housing 202; the upper electrode assembly 225 mounted to a ceiling 228 of the chamber housing 202; the lower electrode assembly 215 mounted to a floor 205 of the chamber housing 202, spaced apart from and substantially parallel to the lower surface of the upper electrode assembly 225; a confinement ring assembly 206 surrounding the gap 232 between the upper electrode assembly 225 and the lower electrode assembly 215; an upper chamber wall 204; and a chamber top 230 enclosing the top portion of the upper electrode assembly 225. The upper electrode assembly 225 comprises the upper electrode 224; and one or more baffles 226 including gas passages for distributing process gas into the gap 232 defined between the upper electrode 224 and the lower electrode assembly 215. For brevity, the upper electrode assembly 225 is shown to have three components. However, the upper electrode assembly 225 can include additional components. The chamber housing 202 has a gate (not shown) through which a substrate 214, is unloaded/loaded into the chamber 200. For example, the substrate 214 can enter the chamber through a load lock as described in commonly-assigned U.S. Pat. No. 6,899,109, which is hereby incorporated by reference in its entirety.

in some exemplary embodiments, the upper electrode assembly 225 is adjustable in up and down directions (arrows A and A' in FIG. 1) to adjust the gap 232 between the upper and lower electrode assemblies 225/215. An upper assembly lift actuator 256 raises or lowers the upper electrode assembly 225. In the illustration, annular extension 229 extending vertically from the chamber ceiling 228 is adjustably positioned along cylindrical bore 203 of the upper chamber wall 204. A sealing arrangement (not shown) may be used to provide a vacuum seal between 229/203, while allowing the upper electrode assembly 225 to move relative to the upper chamber wall 204 and lower electrode assembly 215. An upper flexible coated member 248 electrically couples the upper electrode assembly 225 and the upper chamber wall 204. The upper flexible coated member 248 comprises a conductive and flexible metal strap (233 in FIG. 4) which is coated with a flexible coating (235 in FIG. 4) bonded to the outer surface of the metal strap 233. The flexible coating 235 protects the metal strap from deterioration due to plasma radicals by preventing the metal strap from coming into contact with active species (radicals) generated by the plasma of process gas.

In one embodiment, the flexible coated member 248 base component is an RF strap comprised of beryllium copper (BeCu). However, other flexible, conductive materials may also be utilized. In an embodiment, the flexible coating 235 is comprised of an elastomer or polymer. Preferably, the flexible coating 235 is cross linked siloxane (silicone rubber) which does not include conductive filler particles such as particles of Si, SiC, Al or the like. The upper flexible coated member 248 provides a conductive return path between the upper electrode assembly 225 and the upper chamber wall 204 to allow the electrode assembly 225 to move vertically within the chamber 200. The strap includes two planar ends connected by a curved section. The curved section accommodates movement of the upper electrode assembly 225 relative to the upper chamber wall 204. Depending on factors such as the chamber size, a plurality (2, 4, 6, 8 or 10) RF return straps can be arranged at circumferentially spaced positions around the electrode assembly 225.

For brevity, only one gas line 236 connected to gas source 234 is shown in FIG. 1. Additional gas lines can be coupled to the upper electrode assembly 225, and the gas can be supplied through other portions of the upper chamber wall 204 and/or the chamber top 230.

In other exemplary embodiments, the lower electrode assembly 215 may move up and down (arrows B and B' in FIG. 1) to adjust the gap 232, while the upper electrode assembly 225 may be stationary or movable. FIG. 1 illustrates a lower assembly lift actuator 258 connected to a shaft 260 extending through the floor (bottom wall) 205 of the chamber housing 202 to a lower conducting member 264 supporting the lower electrode assembly 215. According to the embodiment illustrated in FIG. 1, a bellows 262 forms part of a sealing arrangement to provide a vacuum seal between the shaft 260 and the floor 205 of the chamber housing 202, while allowing the lower electrode assembly 215 to move relative to the upper chamber wall 204 and upper electrode assembly 225 when the shaft 260 is raised and lowered by the lower assembly lift actuator 258. If desired, the lower electrode assembly 215 can be raised and lowered by other arrangements. For example, another embodiment of an adjustable gap capacitively coupled plasma processing chamber which raises and lowers the lower electrode assembly 215 by a cantilever beam is disclosed in commonly-assigned co-pending U.S. Patent Application Publication No. 2008/0171444, which is hereby incorporated by reference in its entirety.

If desired, the movable lower electrode assembly 215 can be grounded to a wall of the chamber by at least one lower flexible coated member 246 which electrically couples an outer conductor ring (ground ring) 222 to an electrically conductive part, such as a chamber wall liner 252. The lower flexible coated member 246 comprises a conductive and flexible metal strap and flexible coating bonded to the surface of the flexible metal strap as described above with respect to the upper flexible coated member 248. The flexible coating protects the metal strap from deterioration due to plasma radicals by preventing the metal strap from coming into contact with active species (radicals) generated by the plasma of process gas. The lower flexible coated member 246 electrically couples the outer conductor ring (ground ring) 222 to the upper chamber wall 204 and provides a short RF return path for plasma, while allowing the lower electrode assembly 215 to move vertically within the chamber 200 such as during multistep plasma processing wherein the gap is set to different heights. Preferably, the metal strap is a flexible conductive strap such as a polymer coated BeCu strip.

FIG. 1 further shows an embodiment of a confinement ring assembly 206 to confine a plasma volume proximate the substrate 214 and minimize surface areas with which the plasma interacts. In an embodiment, the confinement ring assembly 206 is connected to a lift actuator 208 such that the confinement ring assembly 206 is moveable in a vertical direction (arrows C-C'), meaning the confinement ring assembly 206 can be manually or automatically raised or lowered with respect to the upper and lower electrode assemblies 225/215 and the chamber 200. The confinement ring assembly is not particularly limited and details of suitable confinement ring assemblies 206 are described in commonly-assigned U.S. Pat. No. 6,019,060 and U.S. Pat. Application Pub. No. 2006/0027328, which are hereby incorporated by reference in their entireties.

The confinement ring assembly 206 can be grounded to a wall of the chamber by at least one flexible coated member 250 which electrically couples the confinement ring assembly 206 to an electrically conductive part such as upper chamber wall 204. FIG. 1 shows a conductive chamber wall liner 252 supported via a horizontal extension 254. The coated flexible member 250 preferably comprises a plurality of metal straps which provide a short RF return path by electrically coupling the confinement ring assembly 206 to the upper chamber wall 204. The coated RF return strap comprises a flexible and conductive metal strip and a protective and flexible coating as described above with reference to the upper flexible coated member 248. The flexible coated members 250 can provide conductive paths between the confinement ring assembly 206 and the upper chamber wall 204 at various vertical positions of the confinement ring assembly 206 within the chamber 200.

In the embodiment shown in FIG. 1, the lower conducting member 264 is electrically connected to an outer conductor ring (ground ring) 222 which surrounds dielectric coupling ring 220 which electrically insulates the outer conductor ring 222 from the lower electrode assembly 215. The lower electrode assembly 215 includes chuck 212, focus ring assembly 216, and a lower electrode 210. However, the lower electrode assembly 215 can include additional components, such as a lift pin mechanism for lifting the substrate, optical sensors, and a cooling mechanism for cooling the lower electrode assembly 215 attached to or forming portions of the lower electrode assembly 215. The chuck 212 clamps a substrate 214 in place on the top surface of the lower electrode assembly 215 during operation. The chuck 212 can be an electrostatic, vacuum, or mechanical chuck.

The lower electrode 210 is typically supplied with RF power from one or more RF power supplies 240 coupled to the lower electrode 210 through an impedance matching network 238. The RF power can be supplied at one or more frequencies of, for example, 2 MHz, 27 MHz and 60 MHz. The RF power excites the process gas to produce plasma in the gap 232. In some embodiments the upper electrode 224 and chamber housing 202 are electrically coupled to ground. In other embodiments the upper electrode 224 is insulated from the chamber housing 202 and supplied RF power from an RF supply through an impedance matching network.

The bottom of the upper chamber wall 204 is coupled to a vacuum pump unit 244 for exhausting gas from the chamber 200. Preferably, the confinement ring assembly 206 substantially terminates the electric fields formed within the gap 232 and prevents the electric fields from penetrating an outer chamber volume 268.

Process gas injected into the gap 232 is energized to produce plasma to process the substrate 214, passes through the confinement ring assembly 206, and into outer chamber volume 268 until exhausted by the vacuum pump unit 244. Since reactor chamber parts in the outer chamber volume 268 can be exposed to reactive process gas (radicals, active species) during operation, they are preferably formed of material, such as stainless steel, that can withstand the process gas or have protective coatings. Likewise, bellows 262 is preferably formed of a material that can withstand the process gas chemistry, such as stainless steel.

In an embodiment where the RF power supply 240 supplies RF power to the lower electrode assembly 215 during operation, the RF power supply 240 delivers RF energy via shaft 260 to the lower electrode 210. The process gas in the gap 232 is electrically excited to produce plasma by the RF power delivered to the lower electrode 210.

In the chamber 200, the flexible coated members 246/248/250 can be RF return straps to provide secure electrical connections as described above between the chamber wall liner 252 or the upper chamber wall 204 and the outer conductor ring (ground ring) 222, the confinement ring assembly 206 and/or the upper electrode assembly 225. During wafer processing, the gap 232 between the upper and lower electrodes 225/215 may be adjusted and the RF return straps undergo bending during such gap adjustment. These coated members create an alternative and shorter RF return path for the plasma when compared to the RF return path that comprises upper chamber wall 204 of the chamber 200. For example, the outer conductor ring 222 is formed of conducting material and electrically insulated from the lower electrode assembly 215 by the dielectric coupling ring 220. The return path is through the upper electrode assembly 225, the flexible coated member 248, upper chamber wall 204, flexible coated member 246, outer conductor ring 222, wall or shield of the shaft 260, to match network 238. The bellows 262 is preferably not part of the return path. The return path can also pass through one or more flexible coated members (not shown in FIG. 1) extending from lower conducting member 264 to floor (bottom wall) 205; and/or pass through one or more flexible coated members (not shown in FIG. 1) extending from floor (bottom wall) 205 to shaft 260.

Preferably, the outer conductor ring 222 is electrically connected to the chamber wall liner 252 by three to twelve flexible coated members 246. More preferably, eight polymer coated RF straps electrically connect the outer conductor ring 222 to the chamber wall liner 252.

As the outer conductor ring 222 moves relative to the upper chamber wall 204 during gap control to facilitate wafer processing or substrate loading/unloading, the flexible coated member 246 is sufficiently flexible to accommodate the relative motion. The flexible coated member 246 is preferably formed from a metal alloy, such as semiconductor grade beryllium copper (BeCu). Preferably, the coating on the flexible coated member 246 is resistant to reactive process gases. The curved section of the flexible coated member 246/248/250 is stretched or compressed due to the relative motion between the upper chamber wall 204 or wall liner 252 and the conductor ring 222/upper electrode assembly 225/confinement ring assembly 206, respectively. The flexible coated members 246/248/250 may have one or more curved sections to accommodate the gap adjustment.

Exposing uncoated conductive flexible metal straps to process gases and/or plasma generated radicals in the chamber housing 202 can create contamination from erosion of the exposed metal of the flexible straps. Plasma generated radicals can also erode supports and components in the outer chamber volume 268 from radicals moving through the confinement ring assembly 206 as well. In addition to the particle and/or metal contamination due to erosion of the straps, the uncoated straps in the vacuum chamber may need to be replaced sooner than scheduled chamber maintenance. Polymer or elastomer coating of metal components such as conductive flexible straps which are exposed to plasma generated radicals significantly increases the component lifetime and reduces unwanted particles and/or metal contamination in the plasma chamber.

Figure 2:
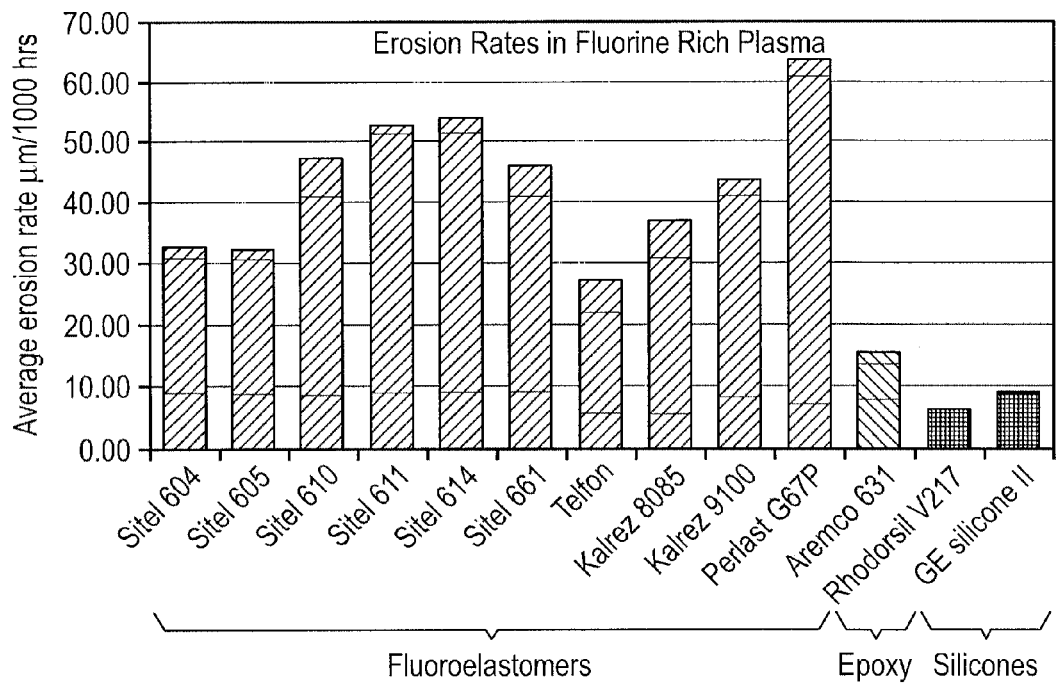
FIG. 2 is a bar graph presenting experimental results of erosion rates in fluorine rich plasma of elastomer coated coupons.
Figure 3:
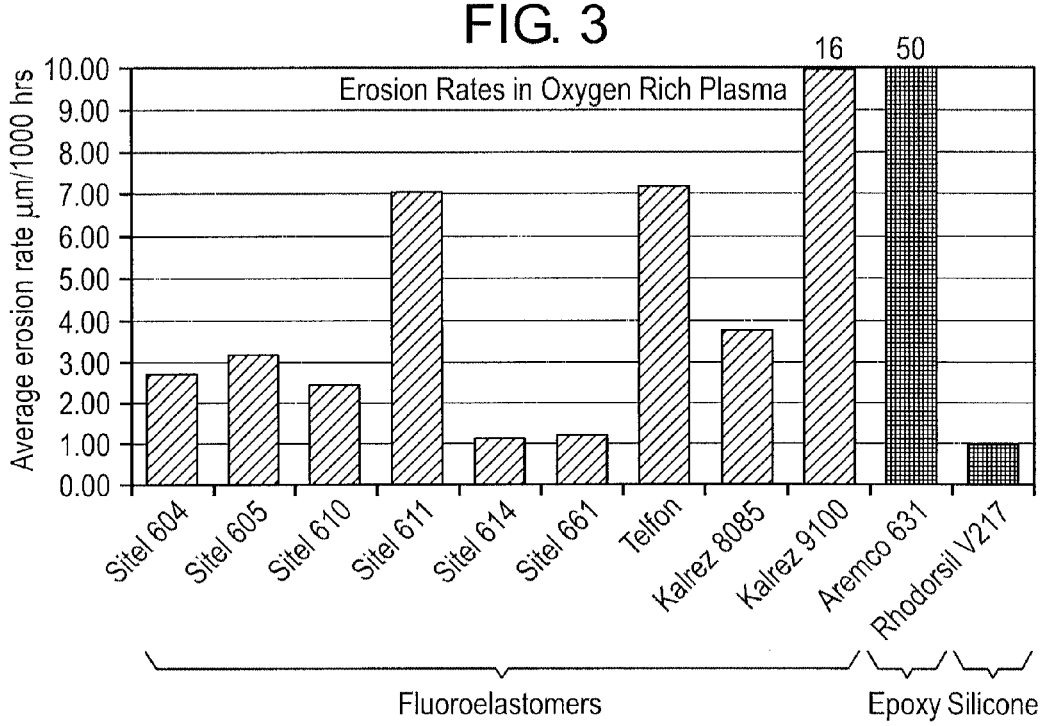
FIG. 3 is a bar graph presenting experimental results of erosion rates in oxygen rich plasma of embodiments of elastomer coated coupons.

To test various coatings, elastomer and polymer coated coupons were exposed to plasma generated fluorine radicals in a plasma chamber such as a plasma etch chamber like the Lam Research 2300 Exelan™ Flex plasma processing system supplied by Lam Research Corporation (www.lamrc.com). The results of these experiments are shown in FIG. 2 as a bar chart and are presented in Table 1. To test resistance to oxygen radicals, elastomer and polymer coatings on coupons were exposed to plasma generated oxygen radicals in a similar manner as described for the coupons exposed to the fluorine radicals. The results of these experiments in oxygen radicals are shown in FIG. 3 as a bar chart and presented in Table 1.

TABLE 1

Experimental test results of erosion of elastomer and polymer flexible coatings in fluorine or oxygen active species (radicals)

| sample no. | material type | trade name (TM) | average erosion rate ($\mu$m/1000 hr) | |
|---|---|---|---|---|
| | | | F radicals | O radicals |
| 1 | perfluoroelastomer | Sifel 604 | 32.9 | 2.7 |
| 2 | perfluoroelastomer | Sifel 605 | 32.5 | 3.2 |
| 3 | perfluoroelastomer | Sifel 610 | 47.7 | 2.5 |
| 4 | 1 part perfluoroelastomer | Sifel 611 | 52.8 | 7.1 |
| 5 | perfluoroelastomer | Sifel 614 | 54.2 | 1.2 |
| 6 | perfluoroelastomer | Sifel 661 | 46.3 | 1.3 |
| 7 | PTFE | Teflon | 27.7 | 7.2 |
| 8 | organic filled perfluoroelastomer | DuPont Kalrez 8085 | 37.4 | 3.8 |
| 9 | silicate filled perfluoroelastomer | DuPont Kalrez 9100 | 44.1 | 16 |
| 10 | organic filled perfluoroelastomer | Perlast G67P | 64.2 | — |
| 11 | two part epoxy | Aremco 631 | 15.7 | 50 |
| 12 | two part unfilled silicone | Rhodorsil V217 | 6.7 | 1.1 |
| 13 | filled silicone | GE silicone II | 9.4 | — |

The elastomer and polymer coatings on the test coupons were eroded when brought into contact with active species (radicals) generated by the plasma of process gas. FIG. 2 shows the average erosion rate in $\mu$m/1000 hr measured after exposure to plasma containing fluorine (F) radicals. The coatings of Samples 1-10 comprised fluoroelastomers. These fluoroelastomers exhibited F radical erosion rates from about 27 $\mu$m/1000 hr for sample 7 (PTFE) to about 64 $\mu$m/1000 hr for sample 10 (organic filled perfluoroelastomer). Sample 11 was a two part epoxy which exhibited significantly improved erosion resistance to the fluorine radical chemistry of about 16 $\mu$m compared to the perfluoroelastomers. Surprisingly, samples 12 and 13 comprised of silicone-type material exhibited far superior erosion resistance to the fluorine radicals than any of the other samples tested. The two part unfilled silicone sample exhibited an average erosion rate of about 7 $\mu$m/1000 hr and the filled silicone sample exhibited an average of about 9 $\mu$m/1000 hr.

FIG. 3 shows the average erosion rate in $\mu$m/1000 hr measured after exposure of elastomer and polymer coated coupons to plasma containing oxygen (O) radicals. In this environment, the fluoroelastomers exhibited erosion rates from about 1.2 $\mu$m/1000 hr for sample 5 (Sifel 614 TM) to about 16 $\mu$m/1000 hr for sample 9 (silicate filled perfluoroelastomer). Sample 11, the two part epoxy, exhibited significantly more erosion when exposed to the oxygen radicals than any of the other samples tested, where the erosion rate was about 50 $\mu$m/1000 hr. Surprisingly, sample 12 which was comprised of the two part unfilled silicone material exhibited far superior erosion resistance to the oxygen radicals than any of the other samples tested. The two part unfilled silicone sample exhibited an average erosion rate of about 1.1 $\mu$m/1000 hr.

As shown by viewing the results in Table 1 and FIGS. 2 and 3, the silicone coatings exhibited significantly better erosion resistance compared to the other materials tested in both fluorine and oxygen radical environments. The Rhodorsil V217™ silicone exposed to fluorine rich plasma had a very low erosion rate compared to the other material types tested with the next most erosion resistant material type having an average erosion rate of nearly twice the Rhodorsil V217™. As shown in FIG. 3, the silicone base material also had a very low erosion rate in an oxygen rich plasma. This result is also surprising since many of the material types tested performed well in only one environment.

The flexible coated members 246/248/250 generally are outside the confined plasma region of the chamber, but under some process conditions, high densities of fluorine and oxygen radicals can exist outside of the confined plasma region. Exposed base metal of the flexible coated members 246/248/250, such as BeCu, can create metal contamination of the processed wafers in the vacuum environment of the processing chamber. Thus the coating on the flexible coated members 246/248/250 is preferably elastic so as to withstand bending while being exposed to fluorine and oxygen rich radical chemistry to provide a markedly improved lifetime of the flexible coated members 246/248/250.

Figure 4:
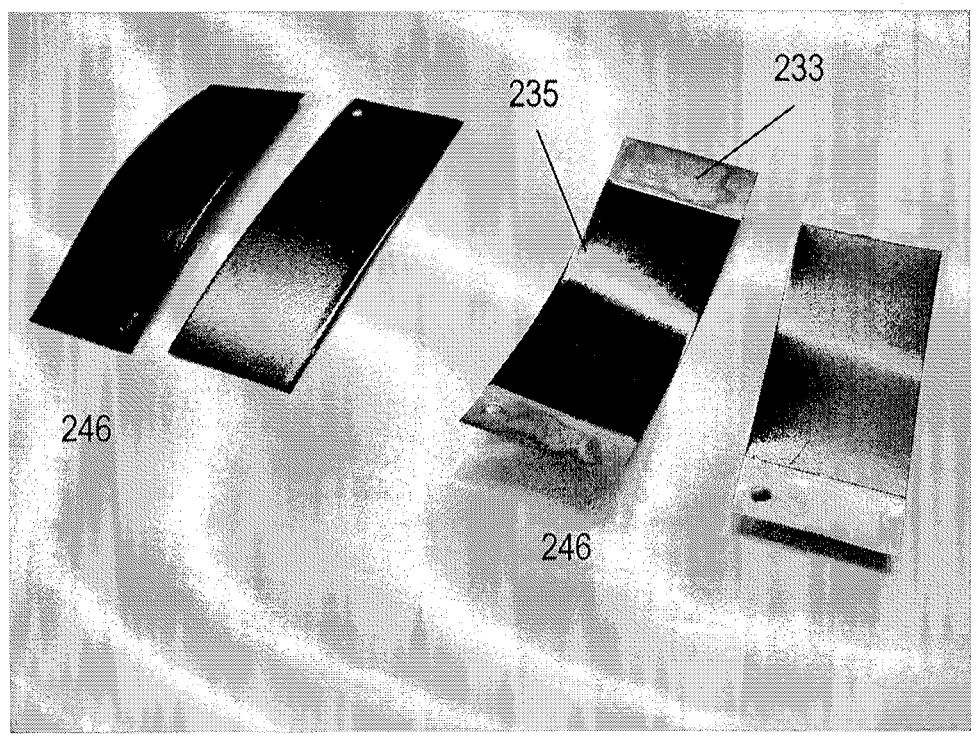
FIG. 4 is a photograph showing embodiments of coated members.

FIG. 4 is a photograph showing an embodiment of the lower flexible coated member 248. The surface of the conductive and flexible metal strap 233 which is exposed to the radical environment was coated with a silicone elastomer material as flexible coating 235.

To coat the flexible components, the flexible metal straps 233 are preferably cleaned prior to applying the coating. For example, a surface of BeCu flexible metal strap can be roughened by sandblasting, primed with a primer compatible with the coating to be applied and dip coated or spray coated with silicone elastomer material after the primer is dry. However, the surface can be coated directly with the silicone elastomer material, that is, without the primer if desired. The coating is preferably cured by any suitable technique. For example, the coating can be heated or subjected to other curing methods to cure the silicone material.

In an embodiment, an elastomer or polymer material provides a flexible coating to a flexible conductive metal component to adhere to the surface of the metal component and protect the metal component from radicals of the process gas. Preferably, the coating is an in-situ cured elastomer or polymer resistant to erosion from radicals in a vacuum environment and resistant to degradation at high temperatures such as above 200° C. Polymeric materials which can be used in plasma environments above 160° C. include polyimide, polyketone, polyetherketone, polyether sulfone, polyethylene terephthalate, fluoroethylene propylene copolymers, cellulose, triacetates, silicone, and rubber.

More preferably, the coating is an in-situ room temperature vulcanized (RTV) unfilled siloxane exhibiting appropriate pre-cure and post-cure properties such as adhesion strength, elastic modulus, erosion rate, temperature resistance and the like. For example, an in-situ curable silicone can be a two-part or one-part curing resin using platinum, peroxide or heat. Preferably, the silicone elastomer material has a Si—O backbone with methyl groups (siloxane). However, carbon or carbon-fluorine backbones can also be used. Most preferably, the silicone material cures in-situ for protection of the base component forming an unfilled, cross-linked silicone rubber. An especially preferred elastomer is a polydimethylsiloxane containing elastomer such as a catalyst cured, e.g. Pt-cured, elastomer available from Rhodia as Rhodorsil V217™, an elastomer which is stable at temperatures of 250° C. and higher.

Figure 5:
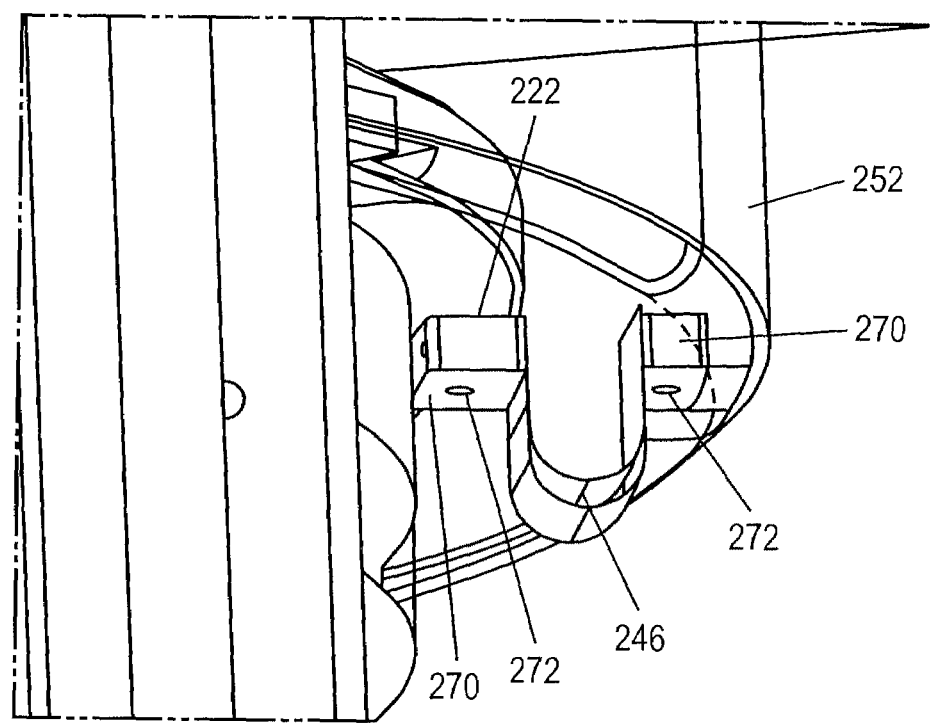
FIG. 5 illustrates an embodiment of a coated member.

FIG. 5 illustrates an embodiment of a flexible and conductive coated member 246 electrically connecting the outer conductor ring 222 to a conductive chamber sidewall liner 252 in an adjustable gap capacitively-coupled plasma reactor chamber 200. FIG. 5 shows electrically conductive connecting members 270 such as stainless steel, copper, aluminum or gold plated metal blocks adapted to electrically connect the conductive and flexible metal strap 233 at uncoated areas (see FIG. 4). The flexible coated member 246 can be 0.002 to 0.020 inch thick, 0.25 to 1 inch wide and 2 to 10 inches long. The flexible metal strap 233 connected to the connecting members 270 is completely protected from radicals by the flexible polymer or elastomer coating 235. One connecting member 270 is a planar section connected to the chamber wall liner 252 on one side and connected to a first end of the flexible coated member 246 on another side. A second end of the coated member 246 is a planar section connected to another connecting member 270 which is connected to the outer conductor ring 222. Fastener holes 272 may be provided in the connecting members 270 adapted to accept fasteners such as screws, rivets, pins and the like to complete the connections. To protect the fasteners from exposure to the oxygen and/or fluorine radicals, the coating can also be provided on exposed surfaces of the fasteners.

Referring to FIG. 2, process gas is introduced into the gap 232 through the upper electrode assembly 225, which may include one or more baffles 226 so that the process gas flows in the gap 232 with a showerhead effect. In the gap 232, the process gas is excited to produce plasma to process a substrate 214 mounted on the top support surface of the lower electrode assembly 215. For example, the substrate 214 can be plasma etched with the process gas.

The gap 232, which is coaxial with the central axis of the substrate 214, is spaced from the upper chamber wall 204 by virtue of the region including the confinement ring assembly 206 and includes the outer chamber volume 268 and the chamber wall liner 252. As the confinement ring lift actuator 208 operates, the confinement ring assembly 206 moves downward or as the lower electrode assembly 215 moves upward, a bottom ring of the confinement ring assembly 206 comes into contact with the shoulder of the outer conductor ring 222. Rings of the confinement ring assembly 206 are preferably formed of a material having high electrical conductivity, such as silicon or silicon carbide having a high electrical conductivity of about 2000 Ω-cm and able to withstand the harsh operational environment of the plasma in the gap 232. The rings may be formed of other suitable conductive materials, such as aluminum or graphite. A post of the confinement ring lift actuator 208 may be formed of metal.

The confinement ring assembly 206 assists in confining the plasma to the space surrounded by the upper and lower electrode assemblies 225, 215 and by the rings, while allowing neutral gas constituents in the gap 232 to pass through gaps in the confinement ring assembly 206 in a generally horizontal direction. Then, neutral gas constituents flow into the outer chamber volume 268 surrounded by the inner surface of the chamber wall 204. The pressure in the outer chamber volume 268 is controlled by the vacuum pump unit 244 attached to the bottom of the chamber wall 204. As such, the confinement ring assembly 206 separates the gap or plasma excitation region 232 from the outer chamber volume 268. In general, the volume of the gap region 232 is small compared to that of the outer chamber volume 268. Because the etch rate of the substrate 214 is directly affected by the plasma in the gap 232, the confinement ring assembly 206 enables a small volume pressure control and plasma confinement over the entire range of the gap 232 without major physical change to the chamber hardware. Also, as the volume of the gap 232 is small, the plasma conditions can be controlled quickly and accurately.

Upon repeated use of the upper electrode assembly 225 and lower electrode assembly 215, the electrode surfaces facing the plasma are gradually eroded by the plasma. The gap 232 can be adjusted to compensate for wear of bottom electrode 210 and upper electrode 224 so that the process repeatability is maintained, and thereby the lifetime of the electrode is extended and cost of consumables is lowered.

Figure 6:
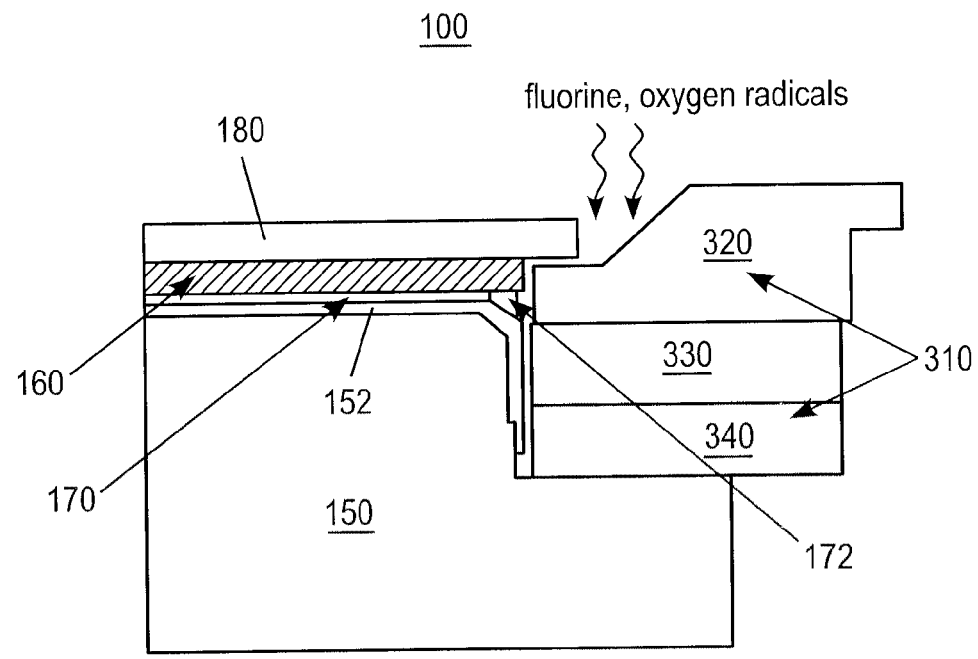
FIG. 6 shows a cross sectional view of a portion of a vacuum processing chamber where an embodiment of a silicone base elastomeric material surrounds an elastomer bond between a lower surface of an electrostatic chucking device and an upper surface of a lower electrode.

FIG. 6 shows a cross section of a substrate (wafer) edge region of a parallel plate plasma apparatus 100 having an elastomer bond 170 joining a chuck 160 to a lower electrode assembly 150 according to one embodiment. The chuck 160 has an upper surface adapted to accept a substrate 180 for plasma processing. A lower surface of the chuck is bonded to an upper surface of the lower electrode assembly 150 by an elastomer bond 170. Details of suitable elastomers are described in U.S. Pat. No. 6,073,577, which is hereby incorporated by reference in its entirety. The lower electrode assembly 150 can optionally include an upper member 152. The elastomer bond 170 is vulnerable to erosion by plasma generated radicals, such as oxygen and fluorine radicals. A silicone base material 172 having improved erosion resistance under plasma generated radical environments is adapted to surround the elastomer bond 170 and seal the upper surface of the lower electrode assembly 150 to the lower surface of the chuck 160. The silicone base material 172 is preferably an in-situ cured unfilled, cross-linked silicone rubber. An especially preferred elastomer is a polydimethylsiloxane containing elastomer such as a catalyst cured, e.g. Pt-cured, elastomer available from Rhodia as Rhodorsil V217™, an elastomer stable at temperatures of 250° C. and higher.

Figure 7:
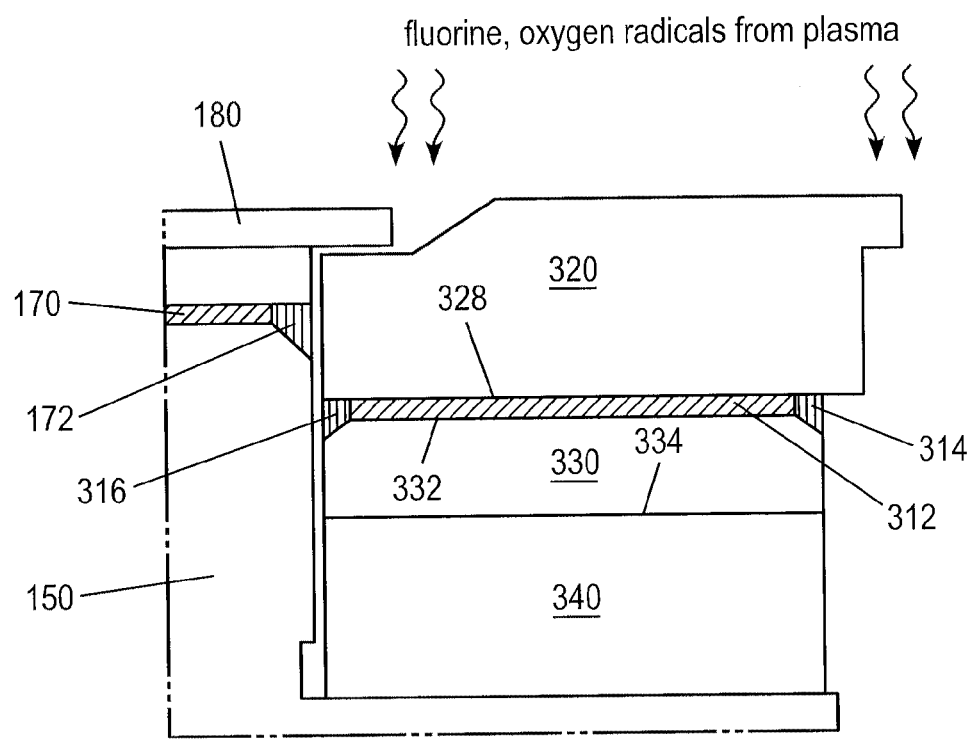
FIG. 7 shows a cross sectional view of a wafer edge region of a parallel plate plasma apparatus where an embodiment of a silicone base elastomeric material surrounds an elastomer bond between a lower surface of an upper hot edge ring and an upper surface of a ceramic intermediate ring in a temperature controlled hot edge ring assembly.

FIG. 7 shows a temperature-controlled hot edge ring assembly 310 adapted to surround the substrate support according to another embodiment. The edge ring assembly 310 includes an upper ring 320, a ceramic intermediate ring 330, and a conductive lower ring 340. The intermediate ring 330 has an upper surface 332 and a lower surface 334, wherein the lower surface 334 of the intermediate ring 330 is thermally coupled to the radio frequency (RF) electrode of lower electrode assembly 150 via the lower ring 340. Details of such a hot edge ring assembly 310 can be found in commonly-owned U.S. Pat. No. 7,244,336, which is hereby incorporated by reference in its entirety.

The upper ring 320 is preferably made of a thermally and electrically conductive material such as silicon, carbon (e.g., graphite), silicon carbide and the like. As shown in FIG. 7, a lower surface 328 of the upper ring 320 is preferably bonded to an upper surface 332 of the intermediate ring 330 by a thermally conductive elastomer. According to an embodiment, silicone base material 314, 316 having improved erosion resistance under plasma generated radical environments is adapted to surround the elastomer bond 312 and seal the upper surface 332 of the intermediate ring 330 to the lower surface 328 of the upper ring 320.

Embodiments of silicone material shaped in O-rings to surround and protect elastomeric bonds as described above are easily replaceable. The O-rings can have cross section shapes to fit and seal gaps between components or have circular cross sections. The silicone material O-rings can be formed in place or preformed and inserted in grooves.

While the invention has been described in detail with reference to specific embodiments thereof, it will be apparent to those skilled in the art that various changes and modifications can be made, and equivalents employed, without departing from the scope of the appended claims.

What is claimed is:

1. An RF return strap for use in a plasma processing apparatus for processing of semiconductor substrates, the RF return strap comprising:
   a curved metal strip having a metal surface and a flexible coating bonded to the metal surface and exposed to plasma generated radicals;
   the flexible coating comprising a silicone or a siloxane, wherein the flexible coating has erosion resistance in an atmosphere of plasma generated radicals and protects the metal strip from the radicals.

2. The RF strap of claim 1, wherein the silicone is an in-situ cured silicone.

3. The RF strap claim 1, wherein the siloxane is an unfilled in-situ cured cross-linked siloxane.

4. The RF strap of claim 1, wherein the metal strip includes two planar sections connected by a curved section, the planar sections being attachable to an electrode and a chamber wall in an adjustable gap capacitively coupled plasma chamber.

5. The RF strap of claim 4, wherein the metal strip is a strip of beryllium copper material.

6. The RF strap of claim 4, wherein the electrode is a bottom electrode.

7. The RF strap of claim 1, wherein the radicals comprise fluorine and/or oxygen.

8. The RF strap of claim 1, wherein the metal strip and the flexible coating has a thickness of about 0.002 to about 0.02 inches.

9. The RF strap of claim 1, wherein the metal strip and the flexible coating has a width of about 0.25 to about 1 inches.

10. The RF strap of claim 1, wherein the metal strip and the flexible coating has a length of about 2 to about 10 inches.

11. The RF strap of claim 1, wherein the siloxane comprises polydimethylsiloxane.

12. A method of processing a semiconductor substrate in a plasma processing apparatus, the method comprising:
   placing a substrate on a substrate support in a reaction chamber of a plasma processing apparatus beneath a top electrode assembly;
   introducing a process gas into the reaction chamber;
   generating a plasma from the process gas in the reaction chamber between the top electrode assembly and the substrate;
   processing the substrate with the plasma; and
   transmitting RF power between parts of the chamber via the RF return strap of claim 1.

13. The method of claim 12, wherein the processing comprises etching the substrate.

14. The method of claim 12, wherein the substrate support is movable vertically and the RF return strap provides a current path between the substrate support and an inner wall of the chamber.

15. The method of claim 13, wherein the top electrode is movable vertically and the RF return strap provides a current path between the top electrode and an inner wall of the chamber.

16. The method of claim 12, wherein the processing includes a first step using plasma containing fluorine radicals and a second step using plasma containing oxygen radicals.

* * * * *